(12) United States Patent
Maishev et al.

(10) Patent No.: US 6,236,163 B1
(45) Date of Patent: May 22, 2001

(54) MULTIPLE-BEAM ION-BEAM ASSEMBLY

(76) Inventors: Yuri Maishev, Russian Federation 113204, Sumskoy Proezd 21, Bldg. 1, Apt. 43, Moscow (RU); James Ritter, 44856 Vista Del Sol, Fremont, CA (US) 94539; Yuri Terentiev, Russian Federation, 129224, Studeny Proezd 28, Apt. 54, Moscow (RU); Leonid Velikov, 1371 Greenbrier Rd., San Carlos, CA (US) 94070; Alexander Shkolnik, 485 Dartmouth Ave., San Carlos, CA (US) 94070

(*) Notice: Subject to any disclaimer, the term of this patent is extended or adjusted under 35 U.S.C. 154(b) by 0 days.

(21) Appl. No.: 09/420,615

(22) Filed: Oct. 18, 1999

(51) Int. Cl.[7] .............................. H01J 7/24; H05B 31/26
(52) U.S. Cl. .................. 315/111.81; 315/111.21; 118/723 MP; 118/723 CB; 118/723 E; 250/492.21; 250/492.3
(58) Field of Search ................ 315/111.21, 111.51, 315/111.71, 111.81; 118/723 MP, 723 CB, 723 E; 156/345; 250/492.21, 492.3; 219/121.48

(56) References Cited

U.S. PATENT DOCUMENTS 5,565,249 * 10/1996 Kurihara et al. ............... 118/723 E

FOREIGN PATENT DOCUMENTS

671681 * 5/1980 (RU) .............................. 315/111.71

OTHER PUBLICATIONS

U.S. application No. 09/161,581, filed Sep. 28, 1948.
U.S. application No. 09/225,159, filed Jan. 4, 1999.
U.S. application No. 09/240,468, filed Jan. 30, 1999.
USSR inventor's Certificate No. 865043.
Kaufman H.R. et al. Characteristics, Capabilities, and Applications of Broad–Beam Sources Commonwealth Scientific Corp., Alexandria, Virginia.

* cited by examiner

Primary Examiner—Michael B. Shingleton

(57) ABSTRACT

A multiple-beam ion-beam assembly consisting of two or more concentrically arranged ring-shaped ion-beam sources having ion-beam slits that emit a plurality of ion beams which overlap on the surface being treated and thus ensure uniformity in distribution of ion currents on the treated surface. Since the ion-beam assembly consists of a plurality of individual source, uniform treatment can be performed on a large surface area. Several embodiments of the invention cover the systems with individual sources adjustable with respect to one another, with an oblique angle of incidence of beams emitted from individual source, and with combination of oblique angles and adjustable sources.

28 Claims, 12 Drawing Sheets

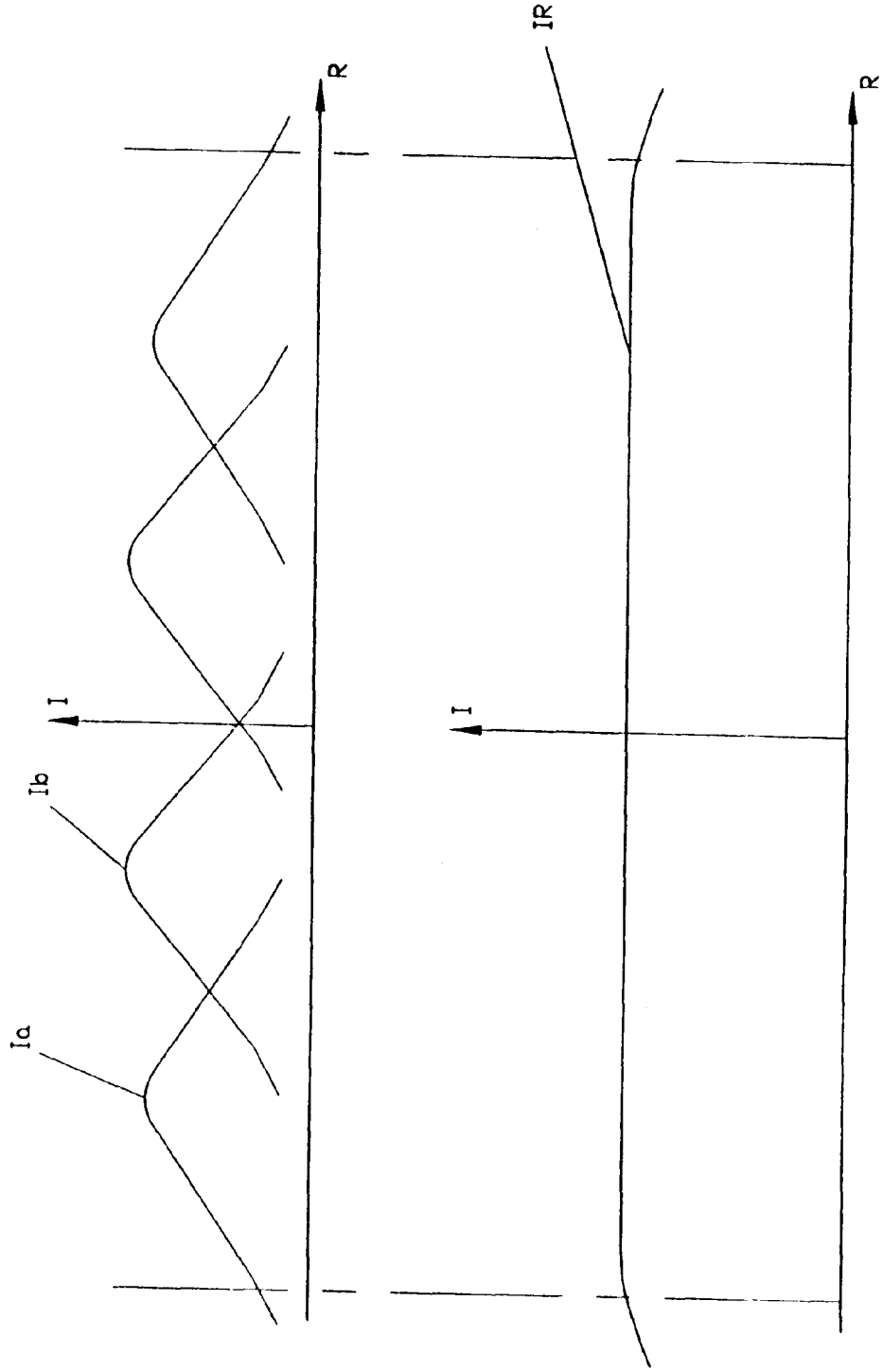

MULTIPLE-BEAM ION-BEAM ASSEMBLY

FIELD OF THE INVENTION

The present invention relates to the field of ion-emission technique, particularly to cold-cathode type ion-beam sources having closed-loop ion-emitting slits with electrons drifting in crossed electric and magnetic fields. More specifically, the invention relates to an ion-beam assembly consisting of two or more coaxially arranged ion-beam sources of the aforementioned type.

BACKGROUND OF THE INVENTION

An ion source is a device that ionizes gas molecules and then focuses, accelerates, and emits them as a narrow beam. This beam is then used for various technical and technological purposes such as cleaning, activation, polishing, thin-film coating, or etching.

For better understanding the principle of the present invention, it would be expedient to describe in detail a known ion-beam source of the type to which the invention pertains. Such an ion source is described, e.g., in Russian Patent No. 2,030,807 issued in 1995 to M. Parfenyonok, et al. The patent describes an ion source that comprises a magnetoconductive housing used as a cathode having an ion-emitting slit, an anode arranged in the housing symmetrically with respect to the emitting slit, a magnetomotance source, a working gas supply system, and a source of electric power supply.

FIGS. 1 and 2 schematically illustrate the aforementioned known ion source with a circular ion-beam emitting slit. More specifically, FIG. 1 is a sectional side view of an on-beam source with a circular ion-beam emitting slit, and FIG. 2 is cross-sectional plan view along line II—II of FIG. 1.

The ion source 22 of FIGS. 1 and 2 has a hollow cylindrical housing 40 made of a magnetoconductive material such as Armco steel (a type of a mild steel), which is used as a cathode. The cathode 40 has a cylindrical side wall 42, a closed flat bottom 44 and a flat top side 46 with a circular ion emitting slit 52.

A working gas supply hole 53 is formed in the flat bottom 44. The flat top side 46 functions as an accelerating electrode. Placed inside the interior of the hollow cylindrical housing 40 between the bottom 44 and the top side 46 is a magnetic system in the form of a cylindrical permanent magnet 66 with poles N and S of opposite polarity. An N-pole faces flat top side 46 and S-pole faces the bottom side 44 of the ion source. The purpose of a magnetic system with a closed magnetic circuit formed by parts the 66, 46, 42, and 44 is to induce a magnetic field in ion emitting slit 52. A circular annular-shaped anode 54 which is connected to a positive pole 56a of an electric power source 56 is arranged in the interior of housing 40 around magnet 66 and concentric thereto. The anode 54 is fixed inside housing 40 by means of a ring 48 made of a non-magnetic dielectric material such as ceramic. The anode 54 has a central opening 55 in which aforementioned permanent magnet 66 is installed with a gap between the outer surface of the magnet and the inner wall of opening 55. A negative pole 56b of electric power source is connected to the housing 40, which is grounded at GR.

Located above the housing 40 of the ion source of FIGS. 1 and 2 is a sealed vacuum chamber 57, which has an evacuation port 59 connected to a source of vacuum (not shown). An object OB to be treated is supported within the chamber 57 above the ion emitting slit 52. The object OB is electrically connected via a line 56c to the negative pole 56b of the power source 56. Since the interior of the housing 40 communicates with the interior of the vacuum chamber 57, all lines that electrically connect the power source 56 with the anode 54 and the object OB should pass into the interior of the housing 40 and the vacuum chamber 57 via conventional commercially-produced electrical feedthrough devices which allow electrical connections with parts and mechanisms of sealed chambers without violation of their sealing conditions. In FIG. 1, these feedthrough devices are shown schematically and designated by reference numerals 40a, 57a, 57b, and 57c.

The known ion source of the type shown in FIGS. 1 and 2 is intended for the formation of a unilaterally directed tubular ion beam. The source of FIGS. 1 and 2 forms a tubular ion beam IB emitted in the direction of arrow A and operates as follows.

The vacuum chamber 57 is evacuated, and a working gas is fed into the interior of the housing 40 of the ion source via a gas-supply tube 53a. An electric field is generated in the ion generation gap 58 and the ion-emitting slit 52 due to an electrical potential applied from the electric power supply 56 between the anode 54 and the upper cathode plate 46. As a result, a glow discharge occurs in the gap 58 after the potential reaches a predetermined value. A magnetic field is generated by the magnet 66 across the ion-emitting slit 52 whereby free electrons of the glow discharge begin to drift in a closed path within the crossed electrical and magnetic fields. When the working gas is passed through the ionization gap, the tubular ion beam IB, which is propagated in the axial direction of the ion source shown by an arrow A, is formed in the area of the ion-emitting slit 52 and in the accelerating gap between the anode 54 and the cathode 40.

The above description of the electron drift is simplified to ease understanding of the principle of the invention. In reality, the phenomenon of generation of ions in the ion source with a closed-loop drift of electrons in crossed electric and magnetic fields is of a more complicated nature and consists in the following.

When, at starting the ion source, a voltage between the anode 54 and cathode 40 reaches a predetermined level, a gas discharge occurs in the anode-cathode gap. As a result, the electrons, which, under of effect of concurrent electrical and magnetic fields, move along complex trajectories, are accumulated and held in the area of the ion-emitting slit 52 and in the anode-cathode gap 58. In fact, the aforementioned electrons drift along the closed-loop slit 52 and exist there over a long period of time. After being accelerated by the electric field, the ions generated in the anode-cathode gap due to collision of neutral molecules with electrons, pass through the ion-emitting slit 52 and are emitted from the ion source.

Strictly speaking, the aforementioned complex trajectories are closed cycloid trajectories. The phenomenon of drift of electrons in the crossed electric and magnetic fields is known as "magnetization" of electrons. The magnetized electrons remain drifting in a closed space between two parts of the cathode, i.e., between those facing parts of the cathode 40 which form the ion-emitting slit 52. The radius of the cycloids is, in fact, the so-called doubled Larmor radius $R_L$ which is represented by the following formula:

$$R_L = m_e V / |e| B,$$

where $m_e$ is a mass of the electron, B is the strength of the magnetic field inside the slit, V is a velocity of the electrons in the direction perpendicular to the direction of the magnetic field, and |e| is the charge of the electron.

A distinguishing feature of the ion source of the type shown FIGS. 1 through 3 is that efficient operation of the source is possible only when the source has the ion-emitting slit and the anode-cathode gap of predetermined geometrical dimensions. More specifically, the width of the ion-emitting slit 52 and the height of the gap 58 should be on the same order as the aforementioned Larmor radius.

When a working medium, such as argon which has neutral molecules, is injected into the slit, the molecules are ionized by the electrons present in this slit and are accelerated by the electric field. As a result, the thus formed ions are emitted from the slit towards the object. Since the spatial charge of electrons has high density, an ion beam of high density is formed. This beam can be converged or diverged by known technique for specific applications.

Thus, the electrons do not drift in a plane, but rather along cycloid trajectories across the ion-emitting slit 52. However, for the sake of convenience of description, here and hereinafter such expression as "electron drifting plane" or "drifting in the plane of ion-beam propagation" will be used.

The diameter of the tubular ion beam formed by means of such an ion source may reach 500 mm and more. The ion source of the type shown in FIG. 1 and FIG. 2 is not limited to a cylindrical configuration and may have an elliptical or an oval-shaped cross.

A disadvantage of the aforementioned ion source with a closed-loop ion-emitting slit is that the position of the tubular ion beam emitted from this source remains unchanged with respect to the surface of the object OB being treated. Furthermore, the aforementioned tubular beam has a non-uniform distribution of the ion beam current in the cross-section of the beam and hence on the surface of the object OB. More specifically, the ion current density across the tubular beam has two maximums in the areas corresponding to the closed-loop slit and one minimum in the center of the "tubular" profile of the beam.

With ever growing demands to the quality and performance characteristics of semiconductor devices, uniformity of treatment of semiconductor wafers becomes a critical issue. This is because even insignificant variations, e.g., in thickness of layers, causes significant variations in parameters of semiconductor devices. Therefore, at the present time deviations from uniformity within the range 5% (i.e., ±2.5%) becomes standard for such operations as etching, stripping (removal of resist), overcoating by sputtering metals or dielectrics, etc. The above ion-beam source with a closed-loop ion-emitting slit and electrons drifting in crossed electric and magnetic fields was given only as one specific example. Known in the art are ion-beam sources of many other types, e.g., the so-called end-Hall type ion-beam source described, e.g., by Kaufman H. R. et al. (Characteristics, Capabilities, and Applications of Broad-Beam Sources, Commonwealth Scientific Corporation, Alexandria, Va.; Wykoff C. A. et al., 50-cm Linear Gridless Source, Eighth International Vacuum Web Coating Conference, Nov. 6–8, 1994) This ion source forms conical or belt-like ion beams in crossed electrical and magnetic fields. The device consists of a cathode, a hollow anode with a conical opening, a system for the supply of a working gas, a magnetic system, a source of electric supply, and a source of electrons with a hot cathode. Configuration of the electrodes used in the ion beam of such sources leads to a significant divergence of the ion beam. As a result, uniform distribution of current density across the beam can be achieved only in the center of the beam. Furthermore, the doze of irradiation with the ions will be essentially reduced simultaneously with a significant increase in the treatment time. This is because only a small portion of the beam which has uniformity is used. In other words, any single-beam ion source will have limits in their practical application for uniform treatment of large-area objects. Another disadvantage of the aforementioned ion-beam source is that the beam is perpendicular to the surface of the object. It is known, however, that when the ion beam fells onto the object at an angle different from normal, the efficiency of sputtering can be increased by three or more times.

In general, methods for providing uniformity in distribution of ion-beam current density across the beam and on the surface of objects treated with ion-beam sources (hereinafter referred to simply as "uniformity") can be roughly divided into the following categories:

1) Uniformity achieved due to beam divergence;
2) Uniformity achieved due to multiple-cell structure of the ion source;
3) Uniformity achieved by alternatingly or periodically changing position of ion beam with respect to the object.

An example of an ion source in which uniformity is achieved due to beam divergence is a device disclosed in U.S. Pat. No. 6,130,507 issued Oct. 10, 2000. This patent application discloses a closed-loop slit cold-cathode ion source where uniformity of treatment of an object is achieved by shifting the anode with respect to the cathode or vice verse.

Such displacements cause variations in relative positions between the object and the beam whereby even with some non-uniformity in the ion current density distribution in the beam, the surface of the object is treated with an improved uniformity.

A disadvantage of such a device is that the ion source or the ion-beam sputtering system should have movable parts which makes the construction of such source or system more complicated and expensive.

An example of a device in which uniformity achieved due to multiple-cell structure is an ion-beam apparatus described in USSR Inventor's Certificate No. 865043. As shown in FIG. 3, which is an elevational sectional view of the ion-beam source 100 of the aforementioned type, the device is made in the form of a multiple-cell source having two cathode plates 102 and 104 which function as magnetic poles. An anode plate 106 with openings is placed between cathode plates 102 and 104. Cathode plate 104 has rods 108a, 108b, 108c, which extend from cathode plate 104 to second cathode plate 102. Second cathode plate 102 has openings 110a, 110b, 110c coaxial with respective rods 108a, 108b, 108c and with openings in anode plate 106. The anode-cathode assembly is supported by a cup-shaped housing 112 of a nonconductive material, such as a ceramic, which contains an electromagnetic coil 114 for generating the aforementioned magnetic field in a anode-cathode space of ion source 100. In a conventional manner, entire ion source 100 is placed into a sealed vacuum chamber 118. A working medium is supplied to vacuum chamber via a working medium supply channel 116.

Thus, each opening 110a, 110b, 110c in cathode plate 102 and a respective coaxial rod 108a, 108b, 108c of the device form an individual ion-beam source of the type described above, i.e., of the type disclosed in Russian Patent No. 2,030,807. More specifically, the end of each rod and the adjacent opening in cathode plate 102 form a closed-loop ion-beam emitting slit, so that all rods and the openings in the second cathode plate form a plurality of such slits. In the context of the present invention, a combination of one rod with a respective opening will be referred to as a "cell", and the ion-beam source of this type will be called a "multiple-cell type ion-beam source". Cathode plates 102 and 104 are electrically isolated from anode plate 106 and can be grounded or connected to a source of a negative potential via a conductor 122, and anode plate 106 is connected to a source of a positive potential (not shown) via a conductor 124.

In operation, a working medium is supplied through channel 116 to the accelerating and ion-generating space between anode plate 106 and cathode plates 102, 104, and a potential difference is developed between the cathode plates and the anode plate. This generates crossed electric and magnetic fields in the anode-cathode space. These fields hold drifting electrons which ionize the working medium and compensate for the spatial charge of the ion beams IB1, IB2, IB3, which are emitted toward an object OB1 via openings in the second cathode plate. Object OB1 is fixed inside vacuum chamber 118.

Although the multiple-channel ion-beam source of the type described above to some extent improves uniformity of ion-current density distribution on the surface of an object being treated, adjustment of distribution of the beam current density on the surface of the treated object OB1 is impossible.

This problem is partially solved in the apparatus 100' shown in a partial side sectional view in FIG. 4 and described in pending U.S. patent application Ser. No. 240,469 filed by the same applicants on Jan. 30, 1999.

As shown in FIG. 1, each rod 108a', 108b', ... has means for individually adjusting magnetic fields in individual ion-emitting slits 110a', 110b', . . . . This, in turn, allows for individually adjusting conditions for ionizing electrons in the ion-emitting slits and, hence, the density of ions emitted through individual ion-emitting slits.

However, the ion-beam source of FIG. 4 produces a plurality of ion beams all of which have direction essentially normal to the surface being treated. In other words, the efficiency of sputtering in this source is still much lower than in the case of angle of incidence different from 90°. Furthermore, the provision of individual electromagnetic coils makes the construction of the ion-beam source more complicated and expensive.

An example of an ion-beam apparatus in which uniformity is achieved by alternatingly changing positions of the ion beam with respect to the object is a device described in U.S. Pat. No. 6,037,717 issued on Mar. 14, 2000. This application describes a cold-cathode ion source with a closed-loop ion-emitting slit which is provided with means for generating a cyclically-variable, e.g., alternating or pulsating electric field in an anode-cathode space. These means may be made in the form of an alternating-voltage generator which generates alternating voltage on one of the cathode parts that form the ion-emitting slit, whereas the other slit-forming part is grounded. The alternating voltage deviates the ion beam in the slit with the same frequency as the frequency of the alternating voltage. The cold-cathode ion source may be of any type, i.e., with the ion beam emitted in the direction perpendicular to the direction of drift of electrons in the ion-emitting slit or with the direction of emission of the beam which coincides with the direction of electron drift.

Displacements of the beam cause variations in relative positions between the object and the beam whereby even with some non-uniformity in the ion current density distribution in the beam, the surface of the object is treated with an improved uniformity.

A disadvantage of all ion-beam sources described above is that none of them allow evacuation of gases from the vacuum chamber through the central opening of the ion beam source. Such a demand, however, may occur in some applications.

U.S. patent application Ser. No. 240,468 filed by the same applicants on Jan. 30, 1999 describes a combined ion-source and sputtering magnetron apparatus having a coldcathode ion source which emits the ion beam in the radial inward or outward direction onto the surface of the magnetron target at an oblique angle to the target surface. This increases efficiency of sputtering. Furthermore, the ion source has a ring-shaped configuration so that gases can be evacuated from the vacuum chamber through the central opening of the ion beam source.

Although such a single-beam ion source produces a converging ion beam with self-overlapping portions, which to some extent can improve uniformity of treatment, the uniform surface area is limited and uniformity is low and cannot be adjusted.

OBJECTS OF THE INVENTION

It is an object of the present invention to provide an ion-beam source which combines in itself simplicity of construction, efficiency of operation, and extremely high uniformity in ion-current density distribution on the surface of an object being treated with an ion beam. Another object is to provide the aforementioned ion-beam source and a method of ion-beam treatment which are not limited with regard to the dimensions of the objects and allow to adjust the uniformity and distribution pattern of ion current on the surface of the object being treated. Still another object is to ensure uniformity of treatment on large treated areas. Further object is to provide an ion-beam source capable of emitting a plurality of ion beams overlapped on the surface being treated. Another object is to provide an ion-beam source with overlapped ion beams having an angle of incidence on the treated surface perpendicular to the surface being treated or different from 90°. Still another object is to provide a multiple-beam ion-beam source in which the beams are emitted onto the surface of the treated object at an oblique angle and in which relative positions of the ion-emitting slits for different beams can be adjusted with respect to each other. Still another object is to provide a method for adjusting uniformity of ion-beam treatment by treating the surface of an object simultaneously with a plurality of ion beams and by adjusting relative positions of the beams on the treated surface. Another object is to provide an ion-beam source assembly suitable for evacuation of gases through the central opening of the ion-beam source.

BRIEF DESCRIPTION OF THE DRAWINGS

FIG. 8*b* is a diagram illustrating distribution of ion currents from individual ion sources on the surface of the treated object.

FIG. 8*c* is a diagram illustrating a resulting distribution of ion currents from all individual ion sources on the surface of the treated object.

SUMMARY OF THE INVENTION

A multiple-beam ion-beam assembly consisting of two or more concentrically arranged ring-shaped ion-beam sources having ion-beam slits that emit a plurality of ion beams which overlap on the surface being treated and thus ensure uniformity in distribution of ion currents on the treated surface. Since the ion-beam assembly consists of a plurality of individual sources, uniform treatment can be performed on a large surface area. Several embodiments of the invention cover the systems with individual sources adjustable with respect to one another. The angle of incidence of the beams can be within the range from 0 to 90° to the treated surface. Some embodiments show a pair of sources with ion beams perpendicular to the treated surface and other embodiments show a combination of sources with oblique angle and with adjustable positions of individual sources.

DETAILED DESCRIPTION OF THE INVENTION

Figure 5:
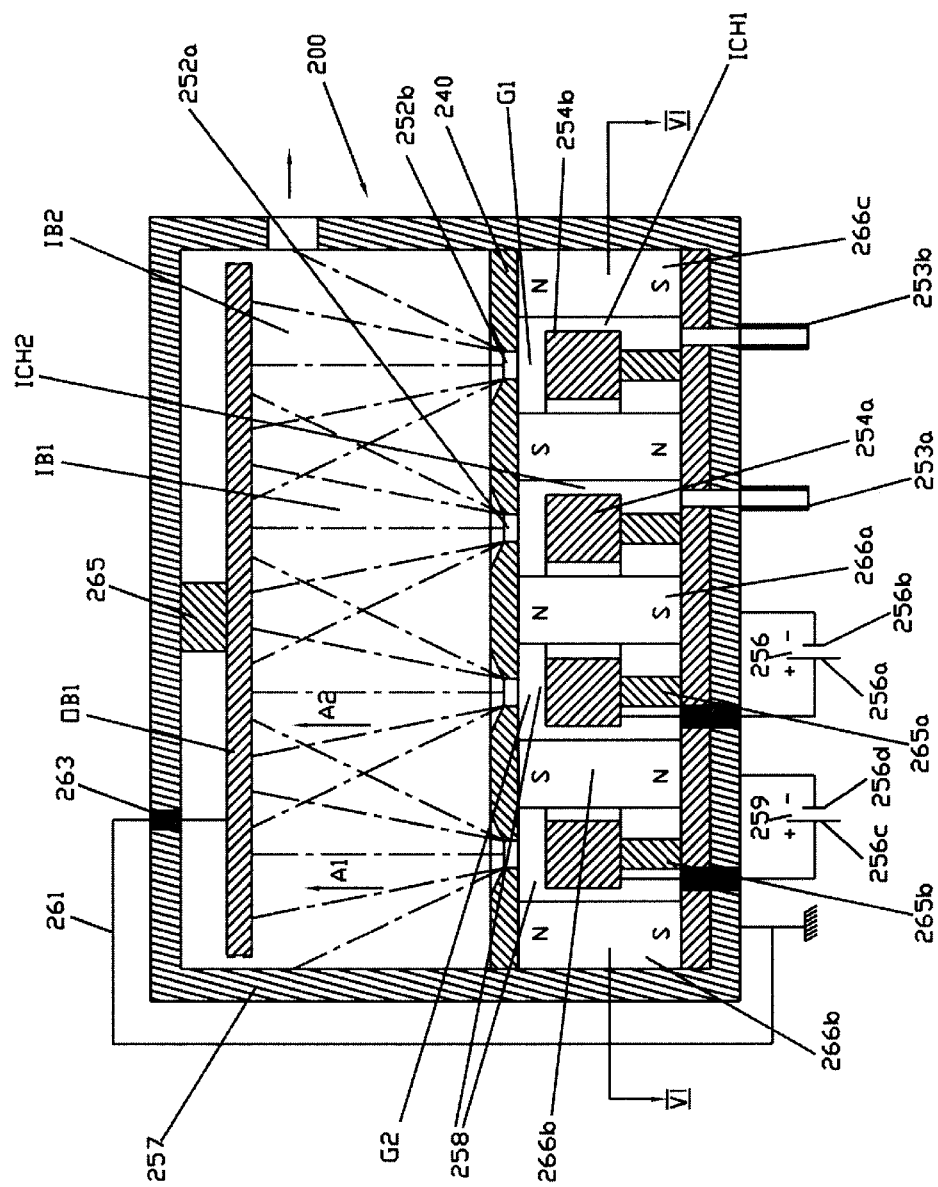
FIG. 5 is a multiple ion-beam assembly of the invention with a plurality of concentric ion-beam sources with ion beams emitted perpendicular to the surface of the treated object.
Figure 6:
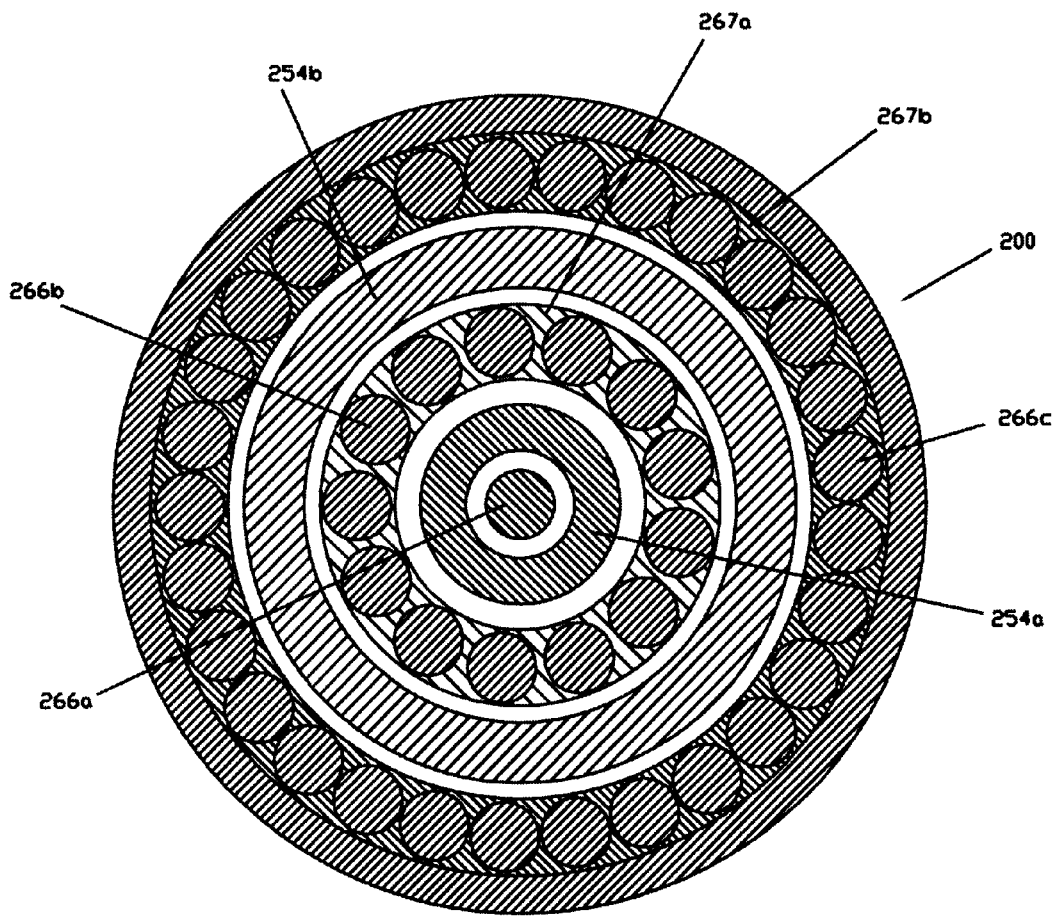
FIG. 6 is a sectional view of the ion-beam assembly along line VI—VI of FIG. 5.
Figure 7:
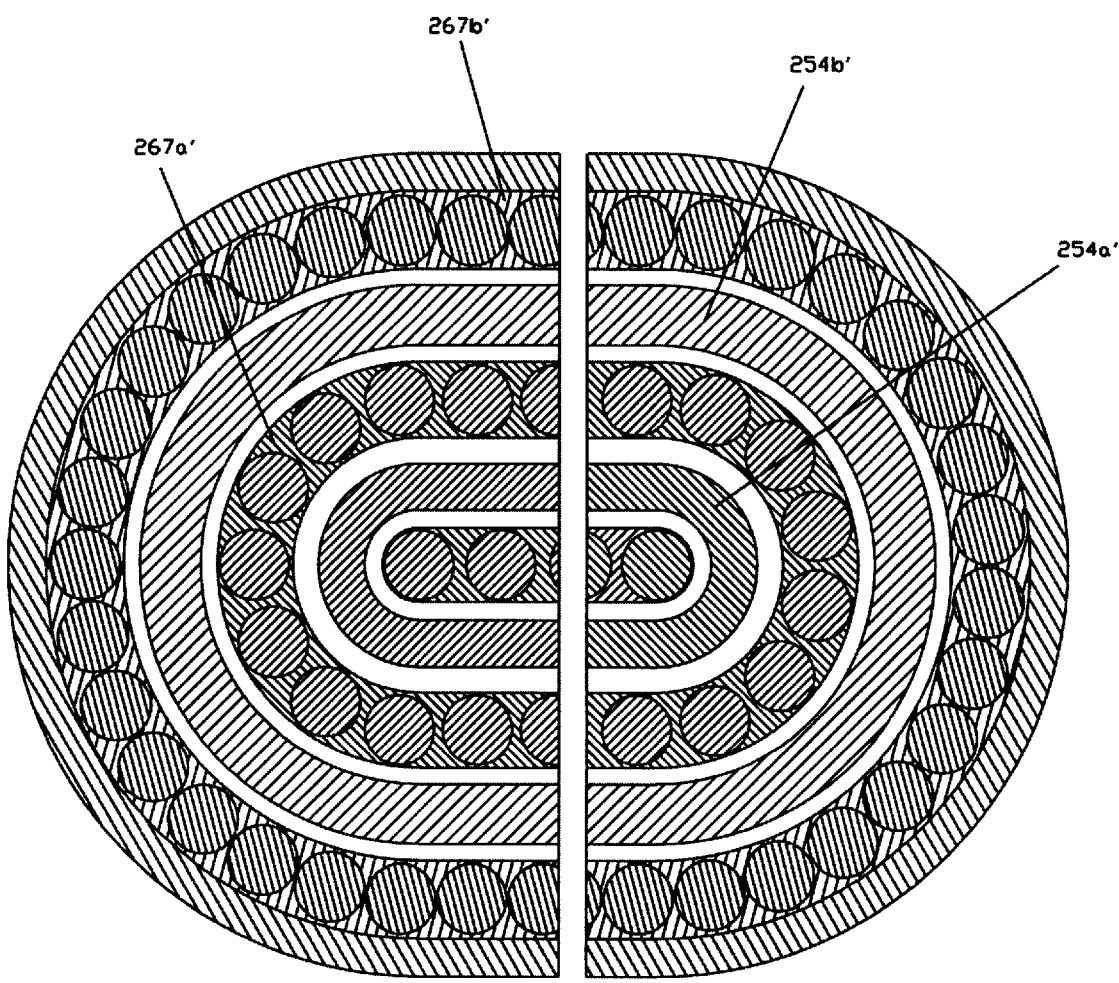
FIG. 7 is a view similar to FIG. 6 illustrating an ion-beam assembly of an oval cross-sectional configuration.

FIGS. 5, 6, and 7—Multiple Ion-Beam Assembly with a Plurality of Non-Adjustable Concentric Ion-Beam Sources with Ion Beams Perpendicular to the Surface of the Treated Object This embodiment of the invention relates to a new principle for achieving uniformity of current density distribution by utilizing a multiple-slit structure of the ion source. FIGS. 5, 6, and 7 illustrate an embodiment of the invention which is a multiple ion-beam assembly with a plurality of concentric ion-beam sources having ion beams emitted perpendicular to the surface of the treated object. Here, FIG. 5 is a side sectional view of the multiple ion-beam assembly of the aforementioned embodiment, FIG. 6 is a sectional view along line VI—VI of FIG. 5, and FIG. 7 is a view similar to FIG. 6 illustrating an ion-beam assembly of an oval cross-sectional configuration.

Figure 1:
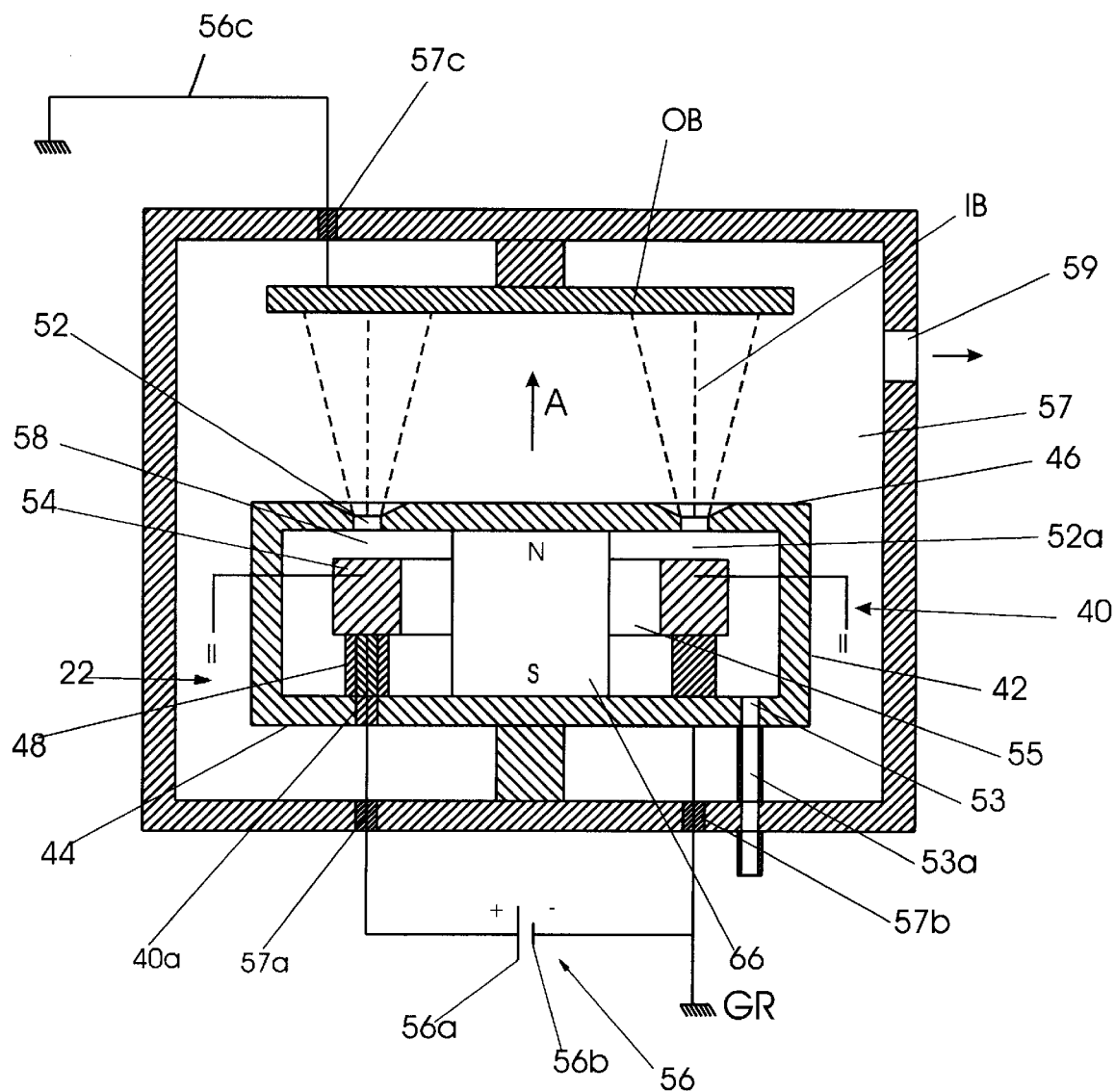
FIG. 1 is a sectional side view of a known ion-beam source with a circular ion-beam emitting slit.
Figure 2:
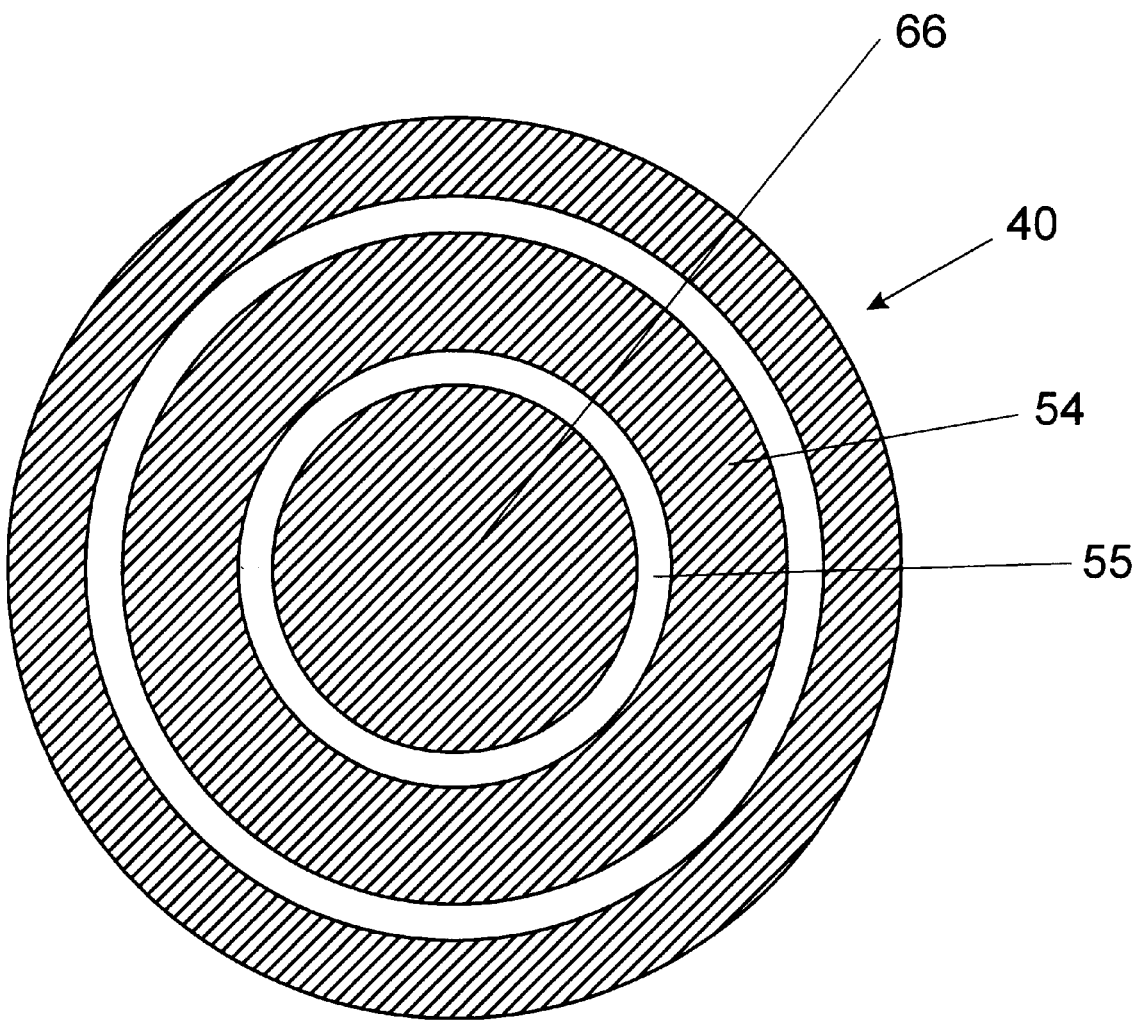
FIG. 2 is a sectional plan view along line II—II of FIG. 1.
Figure 3:
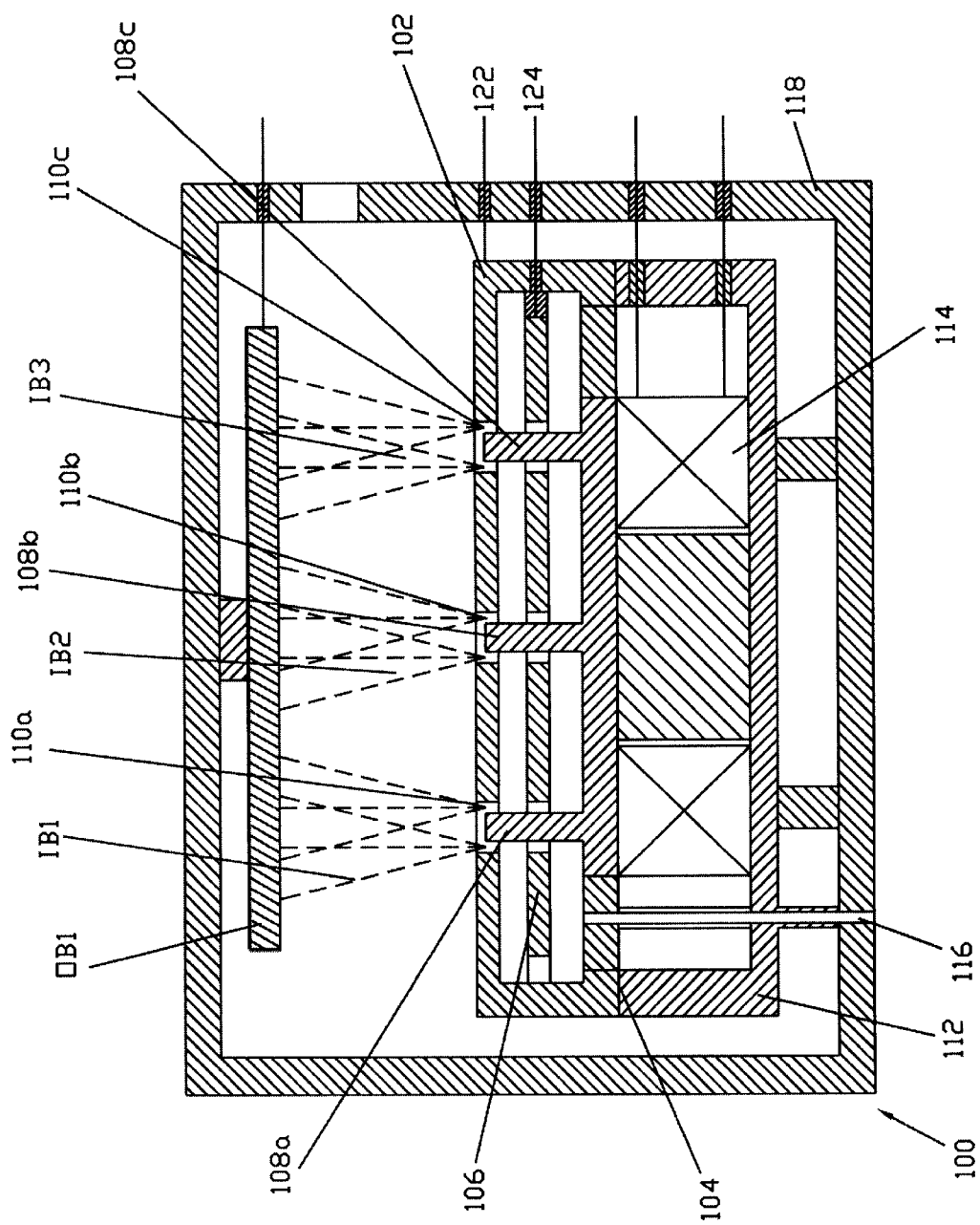
FIG. 3 is a sectional view of a known multiple-cell ion-beam source.
Figure 4:
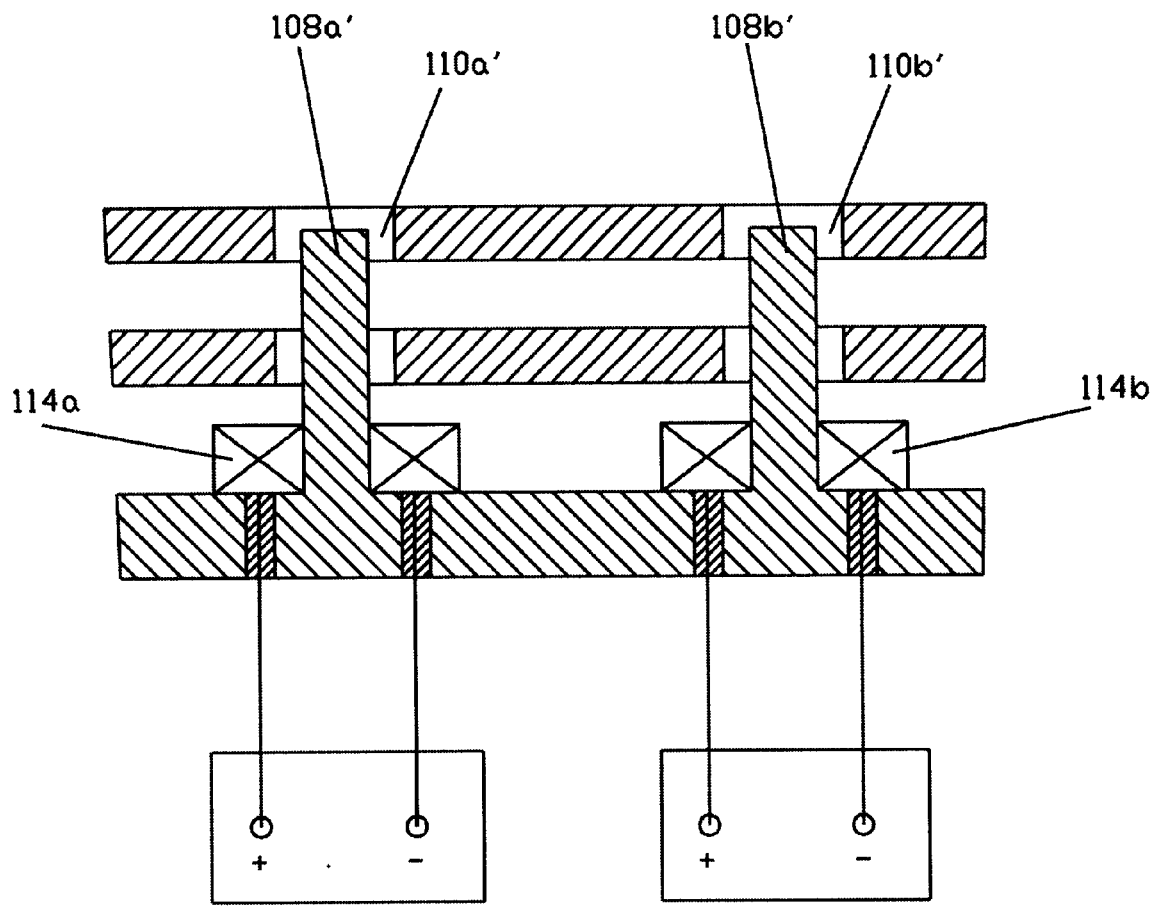
FIG. 4 is a fragmental sectional view illustrating an ion-beam source of the same type as shown in FIG. 3, but with means for individually adjusting ion-current densities in individual cells.

In general, a multiple-beam ion source 200 of FIG. 5 is similar to the one shown in FIGS. 1 and 2 and differs from it in that it has a plurality of concentric emitting slits 252*a* and 252*b*, a plurality of concentric rows of magnets 266*a*, 266*b*, and 266*c*, operating with a common cathode 240, and a plurality of respective concentric anodes 254*a* and 254*b*. In the illustrated embodiments, only three magnets are shown: magnets 266*b* and 266*c* and 266*a*. Of those, magnets 266*b* and 266*c* are a pair of pluralities of magnetic rods arranged a closed circular, elliptical, or oval paths, depending on the shape of the ion-beam slit. The magnet 266*a* is single solid magnetic rod (if the aforementioned path is circular) or one of a plurality of magnetic rods arranged in line in of an oval path, as shown in FIG. 7. Each anode 254*a* and 254*b* is fixed to housing 240 by means of respective block 265*a* and 265*b* of dielectric material and is connected to positive poles 256*a* and 256*c* of respective power sources 256 and 259. Negative poles 256*b* and 256*d* of these power sources are connected to cathode 240. Reference numerals 253*a* and 253*b* designate inlet opening for injection of working media (which may be the same or different) into individual concentric ion-emitting chambers ICH1 and ICH2. In the embodiment illustrated in FIG. 5, chamber ICH2 is located inside of chamber ICH1. Both chambers are sealed from each other by respective ring-shaped holders 267*a* and 267*b* of the respective magnets (FIG. 6).

In the embodiment of FIG. 5, chamber ICH1 has aforementioned closed-loop ion-emitting slit 252*b*, and chamber ICH2 has aforementioned closed-loop slit 252*a*. Slits 252*a* and 252*b* emit concentric diverging ion beams IB1 and IB2 which cover the entire surface of an object OB1.

Similar to the apparatus of FIGS. 1 and 2, ion source 200 is provided with a vacuum chamber 257 which is sealingly connected to housing 240 above ion-emitting slits or into which the entire ion source is placed. Object OB1 is located inside vacuum chamber 257. Object OB1 is grounded via a conductor 261 which passes into vacuum chamber 257 via an electric feedthrough 263. Object OB1 is electrically isolated from the housing of vacuum chamber 257 by a block 265 of dielectric material which is used for securing object OB1 inside vacuum chamber 257.

Ion source 200 of the type shown in FIGS. 5 through 7 is intended for the formation of a unilaterally directed concentric tubular ion beams of diverging shape.

The source operates as follows:

Vacuum chamber 257 is evacuated, and a working gas is fed into the interior of individual ion-emitting chambers ICH1 and ICH2 formed inside housing 240 of the ion source. A magnetic field is generated by concentric magnets 266*a*, 266*b*, and 266*c* ion emitting slits 252*a* and 252*b* and in accelerating gaps G1 and G2 between anode 254 and cathode 240, whereby electrons begin to drift in a closed path within the crossed electrical and magnetic fields. A plasma 258 is formed between anode 254 and cathode 240. When the working gas is passed through ionization and acceleration gap G, tubular ion beams IB1 and IB2, which propagate in the axial direction of the ion source shown by an arrows A1 and A2, are formed in the area of emission slits 252*b* and 252*a* and in accelerating gaps G1 and G2 between anode 254 and cathode 240.

In the embodiment of FIGS. 5, 6, and 7, some uniformity of treatment is ensured due to the fact that the diverging ion beams cover the entire surface of the object OB1. Such an ion source is suitable for treating stationary objects with large surface areas. However, the distribution of ion current density on the surface being treated is still not sufficient for applications where such uniformity is critical. Furthermore, in the ion-beam assembly of FIGS. 5, 6, 7, the pattern of the ion current density distribution on the surface of the object is not adjustable.

FIGS. 8, 8*a*–8*c*—Ion-Beam Source Assembly with Ion Beams Perpendicular to the Surface of the Object and With Individual Ion-Beam Sources Having Positions Adjustable With Respect To Each Other FIGS. 8, 8a–8c illustrates another embodiment of a multiple-beam ion source assembly which consists of a plurality of annular individual concentric ion-beam sources having positions adjustable with respect to each other. Although the ion-beam assembly 300 of this embodiment is illustrated as a set of two individual ion-beam sources, the assembly may consist of three or more individual sources.

Figure 8:
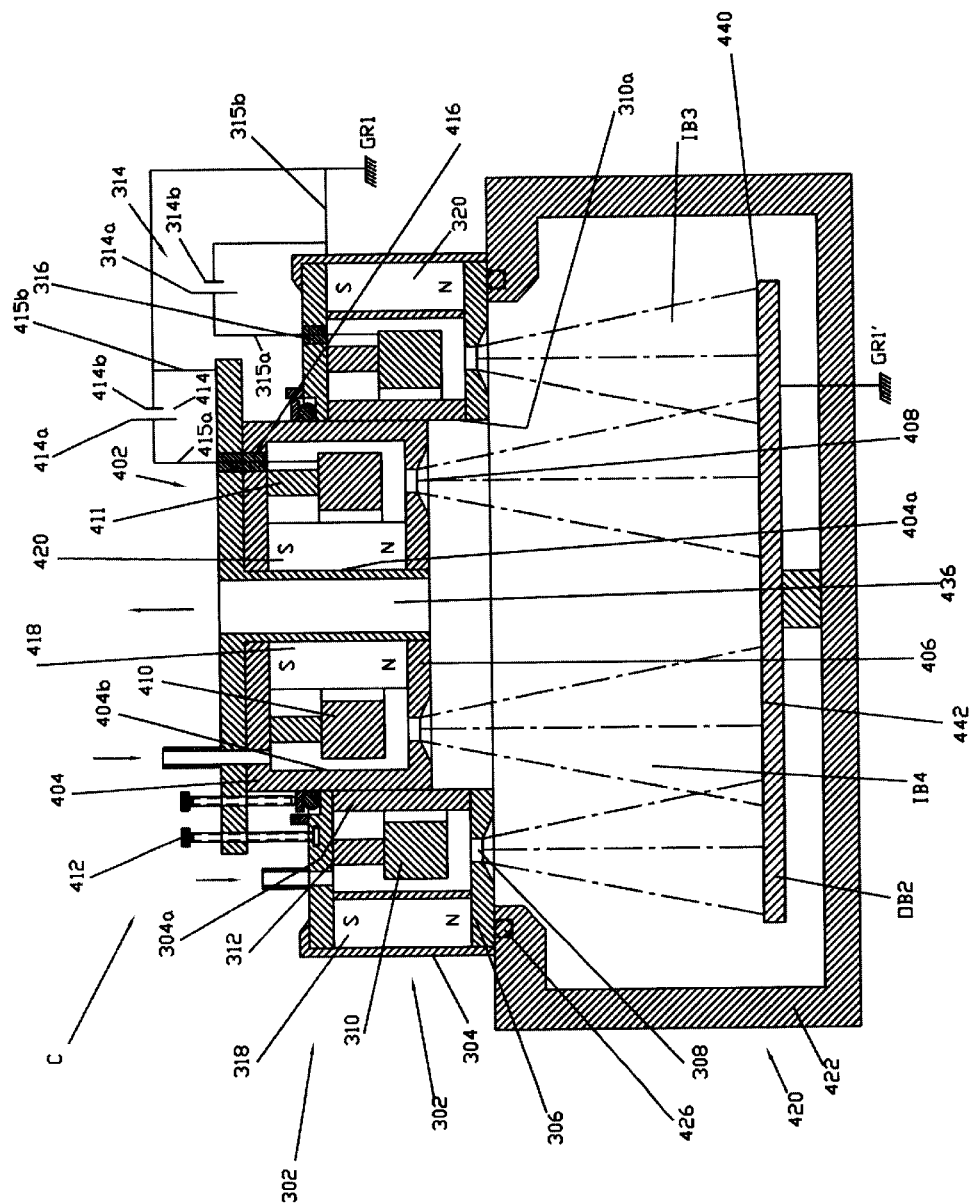
FIG. 8 is an ion-beam source assembly of the type shown on FIG. 5, but with individual ion-beam sources having positions adjustable with respect to each other.

The system of FIG. 8 consists of a first, or an outer ion-beam source 302 and a second, or an inner ion-beam source 402. The outer ion-beam source 302 has a hollow cylindrical housing 304. The lower end plate 306 of the housing 304 functions as a cathode plate of the ion source. The cathode plate 306 has a circular ion-emitting slit 308. Located inside the hollow housing 304 above the slit 308 is an annular anode 310 which is spaced from the inner wall 304a of the housing 304 and is supported by an block 312 of an insulating material, e.g., ceramics, glass, etc. The anode 310 of the first ion-beam source 302 is connected by a conductor 315a to a positive terminal 314a of an electric power source 314 via an electric feedthrough device 316. A negative terminal 314b of the power source 314 is grounded at GR1 and is connected via a conductor 315b to the housing or cathode 304.

In the illustrated embodiment, a magnetic-field generating means for the first or outer ion-beam source 302 is made in the form of a plurality of permanent magnets 318, 320. Although only two of these magnets are shown in FIG. 8, it is understood that a plurality of such magnets are arranged circumferentially and at equal distances from each other between the inner wall 304a of the hollow cylindrical housing 304 and the outer periphery of the annular anode 310.

The inner wall 304a of the first or outer annular ion-beam source 302 serves as a guide for the second or inner annular ion-beam source 402. The inner ion-beam source 402 has a hollow cylindrical housing 404. The lower end plate 406 of the housing 404 functions as a cathode plate of the ion source. The cathode plate 406 has a circular ion-emitting slit 408. Located inside the hollow housing 404 above the slit 408 is an annular anode 410 which is spaced from the inner wall 404b of the housing 404 and is supported by an block 411 of an insulating material, e.g., ceramics, glass, etc. The anode 410 of the first ion-beam source 402 is connected by a conductor 415a to a positive terminal 414a of an electric power source 414 via an electric feedthrough device 416. A negative terminal 414b of the power source 414 is grounded at GR1 and is connected via a conductor 415b to the housing or cathode 404.

In the illustrated embodiment, a magnetic-field generating means for the second or inner ion-beam source 402 is made in the form of a plurality of permanent magnets 418, 420. Although only two of these magnets are shown in FIG. 8, it is understood that a plurality of such magnets are arranged circumferentially and at equal distances from each other between the inner wall 404a of the hollow cylindrical housing 404 and the inner periphery of the annular anode 410.

Figure 8A:
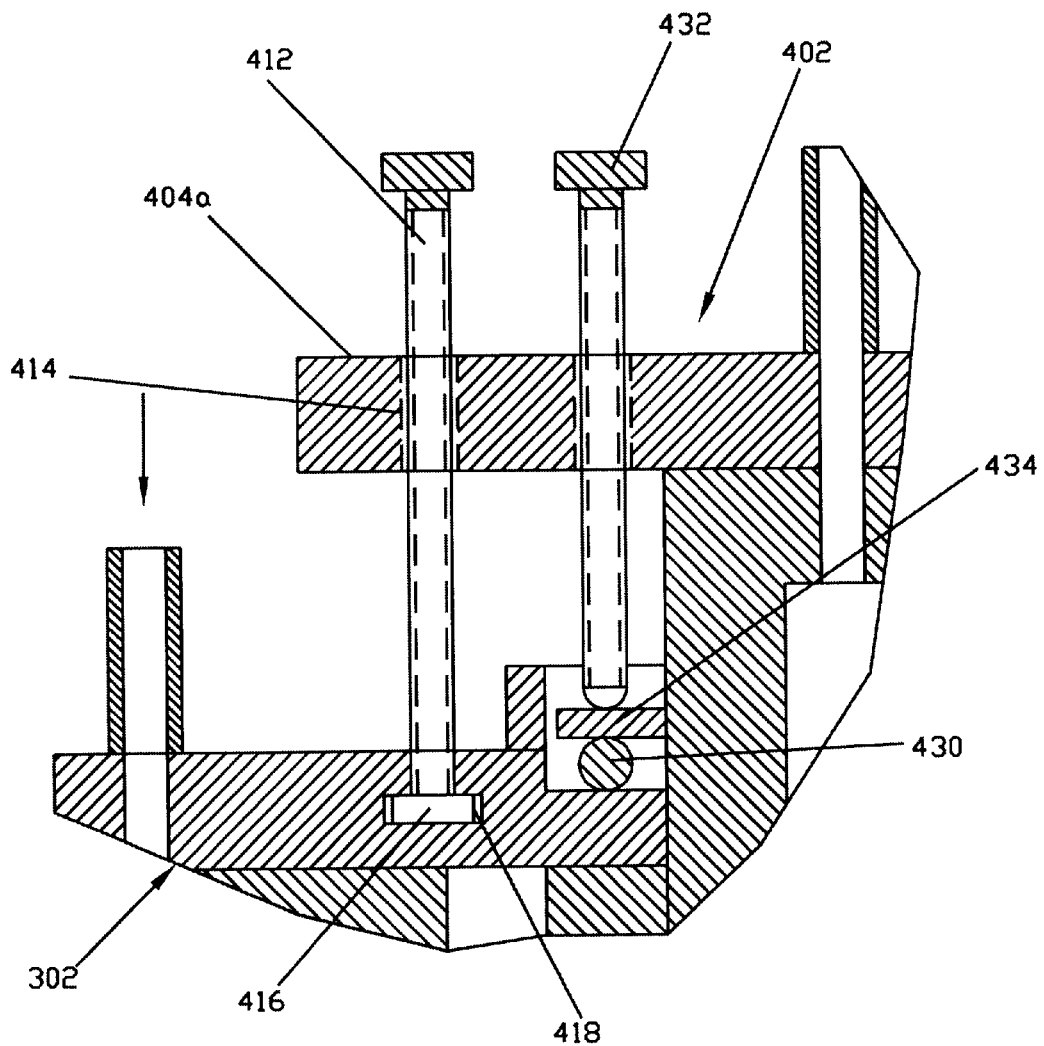
FIG. 8*a* is a fragment C of FIG. 8 shown on a larger scale.

As shown in FIG. 8a, which is fragment C of FIG. 8 shown on a larger scale, position of the second or inner ion-beam source 402 with respect to the first or outer ion-beam source 302 can be adjusted by means of an adjustment screw 412. This screw is threaded into a threaded hole 414 made in a flanged portion 404a of the housing 404 of the inner annular ion-beam source 402. One end of the screw 412 projects outside the flanged portion 404a and has a head, while the opposite end of the screw supports a ring 416 is fixed in a recess 418 of the housing 304 of the outer annular ion-beam source 302 so that it can freely rotate inside the recess but is restricted against movement in the axial direction of the screw. As a result, rotation of the screw 412 will cause the housing 404 of the inner annular ion-beam source 402 to move in a vertical direction in the guide hole formed by the inner wall 310a of the outer annular ion-beam source 302.

An object OB2 to be treated is placed in a vacuum chamber 420 formed by a cylindrical body 422 placed between object OB2, which is grounded at $GR1^1$ and the lower side of the outer annular ion-beam source 302. The space of the vacuum chamber 420 is sealed by seal ring 426. Sliding interface between the outer annular ion-beam source 302 and the inner annular ion-beam source 402 along the guide surface 310a is sealed by a seal ring 430 which is compressed by means of screws via a flat spacer 434 (only one of these screws, i.e., a screw 432 is shown). When the seal ring 430 is compressed, it is deformed outwardly and inwardly in the radial direction and is tightly pressed with its inner surface to the outer cylindrical surface of the housing 404, whereby the interface between the sliding surfaces is sealed.

The vacuum chamber 420 is evacuated through an exhaust pipe 436 which forms an extension of the central opening of the inner annular ion-beam source 402 and is connected to a vacuum pump (not shown).

In a typical operation required for uniform treatment of a large surface area of the object, both ion beam sources, i.e., the outer annular ion-beam source 302 and inner annular ion-beam source 402 are used simultaneously. In principle, each ion-beam source operates in the same manner as the known ion beam source 22 shown in FIG. 1 and the ion-beam source 200 shown in FIG. 6, with the only difference that the outer annular ion-beam source 302 and inner annular ion-beam source 402 have hollow cylindrical, elliptical, or oval shaped housings. Each source has its one gas supply, magnetic field generation, and electric power supply systems described above.

During operation, the outer annular ion-beam source 302 emits a tubular diverging ion beam IB3 through its closed-loop ion-beam emitting slit 308. The beam IB3 falls onto an annular surface 440 of the object OB2. Similarly, the inner annular ion-beam source 402 emits a tubular diverging ion beam IB4 through its closed-loop ion-beam emitting slit 408. The beam IB4 falls onto an annular surface 442 of the object OB2.

FIG. 8b is a diagram illustrating distribution of ion currents from individual ion sources 302 and 402 on the surface of the treated object OB2, and FIG. 8c is a diagram illustrating the resulting distribution of ion currents obtained from both individual ion sources. In FIGS. 8b and 8c, the abscissa axis X shows radial positions of the points on the object OB2, and the ordinate axis I shows densities of the ion-beam currents on the surface of the object OB2. Curve Ia corresponds to the outer annular ion-beam source 302, and curve Ib corresponds to the inner annular ion-beam source 402. It can be seen from FIGS. 8a and 8b that each curve Ia and Ib corresponds to distribution in the radial direction according to the normal law, whereas interposition of the beams IB3 and IB4 "smoothens" the peaks of the Gaussian curves into a more uniform shape shown in FIG. 8c. The pattern of the resulting current density curve IR can be adjusted by displacing the inner annular ion-beam source 402 with respect to the outer annular ion-beam source 302 by means of the adjusting screw 412.

Figure 9:
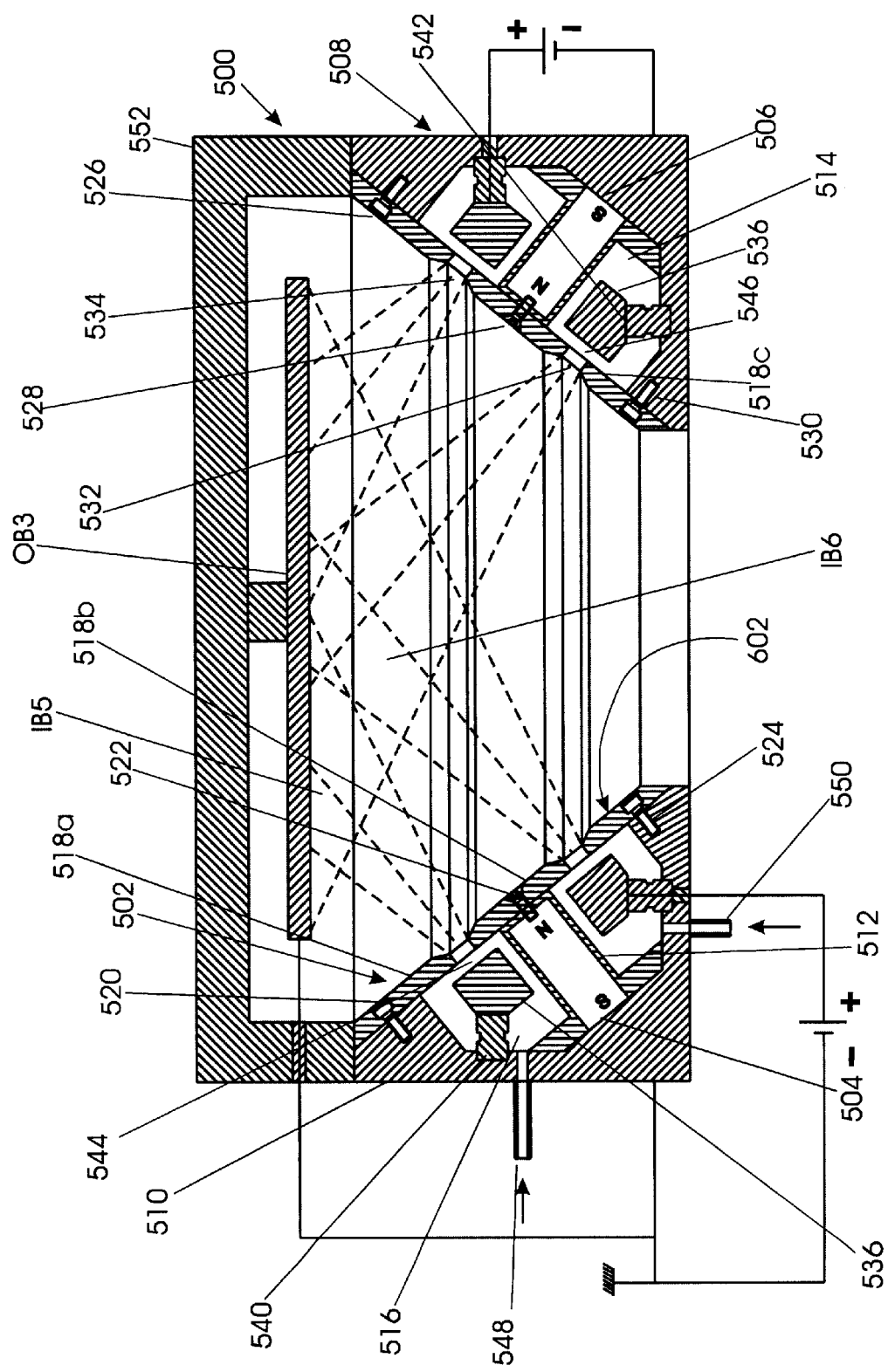
FIG. 9 is a multiple ion-beam assembly of the invention with a plurality of concentric ion-beam sources with ion beams emitted at an oblique angle to the surface of the treated object.

FIG. 9—Multiple Ion-Beam Assembly with a Plurality of Concentric Ion-Beams Having an Oblique Angle to the Surface of the Treated Object FIG. 9 illustrates another embodiment of a multiple-beam ion source assembly 500 which differs from the embodiment of FIG. 8 mainly in that it generates a plurality of concentric ion beams having an oblique angle to the surface of the treated object.

For simplicity of the drawings and explanation, the multiple-beam ion source assembly 500 is shown as a combination only of two separate ion-beam sources 502 and 602, although a greater amount of the individual sources is possible. In the embodiment shown in FIG. 9, positions of both ion-beam sources 502 and 602 with respect to each other remain unchanged and both sources share the same single magnetic field generating system made in the form of a plurality of permanent magnets (only two of which, i.e., 504, 506 are shown).

The multiple-beam ion source assembly 500 has a ring-shaped housing with a cylindrical outer surface 510 (which, in fact, may have any convenient shape, since it does not effect the principle of the invention and is shown cylindrical only for the simplicity) and an upwardly broadening tapered central opening. The ring-shaped housing 508 is hollow and its interior is sealingly separated by a ring-shaped magnet holder 512 into two isolated working chambers 514 and 516. The ring-shaped magnet holder 512 is made in the form of a tapered toroidal ring fit into the inner space of the hollow housing 508. Magnet holder 512 has a plurality of uniformly spaced through holes for insertion of permanent magnets 504, 506, etc. The inner surface of the housing 508 is coated with three ring-shaped bodies 518a, 518b, and 518c made in the form of truncated conical rings which are attached to the appropriately shaped inner wall of the housing 508, e.g., by screws 520, 522, 524, 526, 528, and 530. Rings 518a, 518b, and 518c have such dimensions and are attached to the housing 508 so that two closed-loop ion-emitting slits 532 and 534 are formed.

The working chamber 516 of the ion-beam sources 502 contains a ring-shaped anode 536 which is supported inside the working chamber 516 by a ring 540 of an insulating material such as ceramic. Similarly, the working chamber 514 of the ion-beam sources 602 contains a ring-shaped anode 536 which is supported inside the working chamber 514 by a ring 542 of an insulating material such as ceramic. Both anodes are shown as rings of a polygonal cross-section suitable for fitting into the inner space of the respective working chambers so as to form respective ionization and ion-accelerating gaps 544 (in the working chamber 516) and 546 (in the working chamber 514).

Reference numerals 548 and 550 designate channels for the supply of working gases to respective working chambers 516 and 514 of the individual ion-beam sources 502 and 602, respectively. Grounding and electric power supply circuits and power sources are not designated, as they are the same as in the previous embodiment of the invention.

An object OB3 is supported in a vacuum chamber 552 which is shown only partially.

In operation, the ion-beam source 502 emits ion beam IB5, and the ion-beam source 602 emits the ion-beam IB6 so that both ion beams overlap and ensure uniform distribution of the ion-beam current density on the surface of an object OB3.

An advantage of the ion-beam source assembly 500 shown in FIG. 9, as compared to the embodiment shown in FIG. 8, is that the ion beams IB5 and IB6 impinge the surface of the object OB3 at angles oblique to the surface of the object. As has been mentioned above, such direction of the beams ensure higher efficiency of sputtering of particles from the surface of the object.

Figure 10:
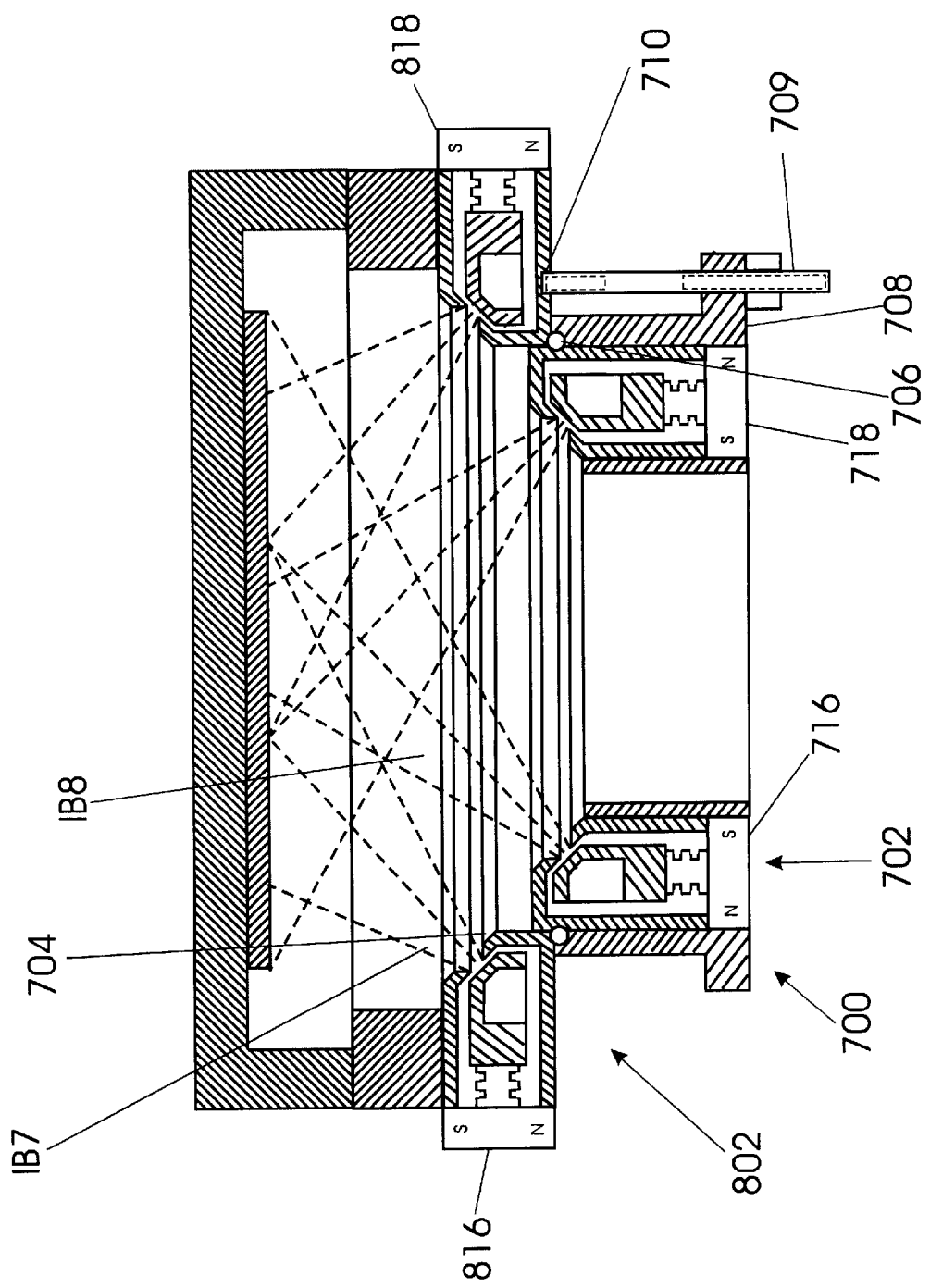
FIG. 10 is an ion-beam source assembly of the type shown on FIG. 7, but with individual ion-beam sources having positions adjustable with respect to each other.

FIG. 10—Ion-Beam Source Assembly with Individual Ion-Beam Sources Having Oblique Ion Beams and Positions Adjustable with Respect to Each Other FIG. 10 illustrates ion-beam assembly 700 of another embodiment, which, in fact, is a combination of the embodiments of FIGS. 8 and 9. In other words, this assembly consists of two individual ion-beam sources, i.e., an inner ion-beam source 702 and an outer ion-beam source 802. The inner ion-beam source 702 is slidingly installed in the central opening 704 of the outer ion-beam source 802, and the sliding interface between the sources is sealed by a seal ring 706 compressible by the end face of a flanged sleeve 708. The sleeve 708 is pressed against the seal ring 706 by threading a screw 709 into the threaded opening 710 of the outer ion-beam source 802.

The inner ion-beam source 702 is shifted with respect to the outer ion beam source 802 by means of an adjustment screw of the type similar to the case of FIG. 8a (not shown in FIG. 10). Each ion-beam source 702 and 802 has an individual gas supply channel, an electric power supply system (not shown), and a magnetic field generation system. In the inner ion-beam source 702 the magnetic field generation system is shown as a plurality magnets 716, 718, etc., located on the inner side of the ion-beam source 702, whereas in the outer ion-beam source 802 the magnetic field generation system is shown as a plurality of magnets 816, 818, etc., located on the outer side of the outer ion-beam source 802. The rest of the construction is similar to the elements of both embodiments of FIGS. 8 and 9, and therefore their detailed description is omitted.

The ion-beam source assembly of FIG. 10 operates in the same manner as the devices of the previous embodiments and is characterized by the fact that individual ion-beam sources not only have oblique angles of their ion beams IB7 and IB8, but also are adjustable with respect to each other, thus combining advantages of both previous embodiments.

Thus it has been shown that the invention provides a multiple-beam ion-beam assembly which is simple in construction, efficient in operation, provides extremely high uniformity in ion-current density distribution on the surface an object being treated, is not limited with regard to the dimensions of the objects and allows to adjust the uniformity and distribution pattern of ion current on the surface of the object, ensures uniformity of treatment on large treated areas, is capable of emitting a plurality of ion beams overlapped on the surface of the object, provides overlapped ion beams which have angle of incidence on the treated surface different from 90°, provides adjustment in relative positions of different ion beams with respect to each other. The invention also provides a method for adjusting uniformity of ion-beam treatment by treating the surface of an object simultaneously with a plurality of ion beams and by adjusting relative positions of the beams on the treated surface. The invention provides an ion-beam source assembly suitable for evacuation of gases through the central opening of the ion-beam source.

Although the invention was shown and described with reference to specific embodiments having specific materials and shapes of the parts and units of the apparatus and method, it is understood that these embodiments were given only as examples and that any modifications and changes are possible, provided they do not depart from the scope of the patent claims attached below. For example, the ion-beam assembly may comprise a combination of sources with ion beams perpendicular and inclined to the surface of the object. Three or more than three ion beam sources of the same or different types can be used in a single multiple-beam assembly. In operation, individual ion-beam sources can be used simultaneously, in alternating order, or in any sequence required for the process. The inner annular ion-beam source can be stationary and the outer annular ion-beam source can be moveable. The mechanism for shifting ion sources with respect to each other can be different from the screw-type mechanism. For example, it can be a rack-and-pinion mechanism, a hydraulic mechanism, a mechanism driven from a stepper-motor, etc. The ion source assembly can be used for coating, etching, activation, cleaning, etc.

What is claimed is:

1. An ion-beam source assembly comprising at least two concentric ion-beam sources, one of which is an outer ion-beam source and another is an inner ion-beam source, each said ion-beam source having an individual anode, gas supply system, and an ion-emitting slit of a closed-loop configuration.

2. The ion-beam source assembly of claim 1, further comprising means for shifting at least one of said at least two concentric ion-beam sources with respect to the other one.

3. The ion-beam source assembly of claim 1, wherein said closed-loop configuration is selected from a group consisting of an oval circular, and elliptical configuration.

4. The ion-beam source assembly of claim 3, wherein at least one of said at least two ion-beam sources is a cold-cathode type ion-beam source with electrons drifting in crossed electric and magnetic fields.

5. The ion-beam source assembly of claim 4, wherein at least one of said at least two ion-beam sources has direction of the ion beam perpendicular to the surface of an object being treated.

6. The ion-beam source assembly of claim 5, wherein said ion beam is a diverging ion beam.

7. The ion-beam source assembly of claim 6, having means for sealingly connecting said ion-beam assembly to a vacuum chamber, said object being located in said vacuum chamber, said inner ion-beam source has a central opening which is connected to means for evacuating gas from said vacuum chamber through said central opening.

8. The ion-beam assembly of claim 7, further comprising means for shifting at least one of said at least two concentric ion-beam sources with respect to the other one and means for sealing an interface between said at least two ion-beam sources in order to prevent penetration of air into said vacuum chamber during relative motion of said at least one of said ion-beam sources with respect to the other one.

9. The ion-beam assembly of claim 7, wherein said means for shifting at least one of said at least two concentric ion-beam sources comprises a screw mechanism having a screw which is threaded into one of said ion-beam sources and installed rotationally in but with axial fixation with respect to the other of said ion-beam sources.

10. The ion-beam source assembly of claim 4, wherein at least one of said at least two ion-beam sources has direction of the ion beam oblique to the surface of an object being treated.

11. The ion-beam source assembly of claim 10, wherein said ion beam is a diverging ion beam.

12. The ion-beam source assembly of claim 11, having means for sealingly connecting said ion-beam assembly to a vacuum chamber, said object being located in said vacuum chamber, said inner ion-beam source has a central opening which is connected to means for evacuating gas from said vacuum chamber through said central opening.

13. The ion-beam assembly of claim 12, further comprising means for sealing an interface between said at least two ion-beam sources in order to prevent penetration of air into said vacuum chamber during relative motion of said at least one of said ion-beam sources with respect to the other one.

14. The ion-beam assembly of claim 12, wherein said means for shifting at least one of said at least two concentric ion-beam sources comprises a screw mechanism having a screw which is threaded into one of said ion-beam sources and installed rotationally in but with axial fixation with respect to the other of said ion-beam sources.

15. A method for treating an object with a plurality of ion beams having a closed-loop cross-section in the direction perpendicular to the direction of propagation of said ion beams, comprising:

providing a multiple-beam ion-beam source assembly consisting of at least two individual concentric annular-shaped ion-beam sources comprising an outer ion-beam source and an inner ion-beam source;

placing said object into a vacuum chamber;

sealingly connecting said multiple-beam ion-beam source assembly to said vacuum chamber;

emitting at least two ion beams from said individual ion-beam sources onto the surface of said object; and distributing said ion beams on said surface so as to provide a uniform distribution of ion-beam currents on said surface.

16. The method of claim 15, wherein said step of distributing further comprises displacement of at least one of said ion beams with respect to the other.

17. The method of claim 16, wherein at least one of said ion beams is a diverging ion beam.

18. An ion-beam source assembly comprising:

an outer ring-shaped ion-beam source;

an inner ion-beam source arranged around said inner ion-beam source, each said ion-beam source comprising a cold-cathode type closed-loop type ion-beam source with electrons drifting in crossed electric and magnetic fields, each said ion-beam source having an individual anode, a gas supply system, and an ion-emitting slit of a closed-loop configuration.

19. The ion-beam source assembly of claim 18, further comprising means for shifting at least one of said ring-shaped ion-beam sources with respect to the other one, said closed-loop configuration being selected from a group consisting of an oval, circular, and elliptical configuration, each of said ring-shaped ion-beam sources having a direction of the ion beam emitted through said closed-loop ion-emitting slit at an angle within the range from 0 to 90° to the surface of an object being treated.

20. The ion-beam source assembly of claim 19, wherein said ion beam is a diverging ion beam.

21. The ion-beam source assembly of claim 20, having means for moving one of said ion-beam sources with respect to the other and means for sealingly connecting said ion-beam assembly to a vacuum chamber, said object being located in said vacuum chamber, said inner ion-beam source has a central opening which is connected to means for evacuating gas from said vacuum chamber through said central opening.

22. The ion-beam assembly of claim 21, further comprising means for sealing an interface between said two ion-beam sources in order to prevent penetration of air into said vacuum chamber during operation of said ion-beam assembly and during relative motion of said at least one of said ion-beam sources with respect to the other.

23. The ion-beam assembly of claim 22, wherein said means for shifting at least one of said concentric ion-beam sources comprises a screw mechanism having a screw which is threaded into one of said ion-beam sources and installed rotationally in but with axial fixation with respect to the other of said ion-beam sources.

24. The ion-beam source assembly of claim 23, wherein both said ion-beam sources have direction of ion beams oblique to the surface of an object being treated.

25. The ion-beam source assembly of claim 24, wherein said ion beams are diverging ion beams.

26. The ion-beam source assembly of claim 25, having means for sealingly connecting said ion-beam assembly to a vacuum chamber, said object being located in said vacuum chamber, said inner ion-beam source has a central opening which is connected to means for evacuating gas from said vacuum chamber through said central opening.

27. The ion-beam assembly of claim 26, further comprising means for sealing an interface between said at least two ion-beam sources in order to prevent penetration of air into said vacuum chamber during relative motion of said at least one of said ion-beam sources with respect to the other one.

28. The ion-beam assembly of claim 27, wherein said means for shifting at least one of said at least two concentric ion-beam sources comprises a screw mechanism having a screw which is threaded into one of said ion-beam sources and installed rotationally in but with axial fixation with respect to the other of said ion-beam sources.

* * * * *